(12) United States Patent
Pundak

(10) Patent No.: US 6,298,670 B1
(45) Date of Patent: Oct. 9, 2001

(54) COOLING DEVICE FOR RF FILTERS AND A LOW NOISE AMPLIFIER

(75) Inventor: Nachman Pundak, Israel (IL)

(73) Assignee: Ricor Ltd., Kibbutz Ein Harod Yichud (IS)

( * ) Notice: Subject to any disclaimer, the term of this patent is extended or adjusted under 35 U.S.C. 154(b) by 0 days.

(21) Appl. No.: 09/442,901

(22) Filed: Nov. 18, 1999

(30) Foreign Application Priority Data

Nov. 19, 1998 (IL) .......................................... 127147

(51) Int. Cl.[7] ............................... F25D 9/00; F25D 23/12
(52) U.S. Cl. .................................................. 62/6; 62/259.2
(58) Field of Search ........................................ 62/6, 259.2

(56) References Cited

U.S. PATENT DOCUMENTS

| | | | | |
|---|---|---|---|---|
| 5,144,805 | * | 9/1992 | Nagao et al. ............................... | 62/6 |
| 5,251,456 | * | 10/1993 | Nagao et al. ......................... | 62/259.2 |
| 5,323,293 | * | 6/1994 | Angiulli et al. ....................... | 361/699 |
| 5,333,464 | * | 8/1994 | Laskaris et al. ....................... | 62/51.1 |
| 5,647,218 | * | 7/1997 | Kuriyama et al. .......................... | 62/6 |
| 5,934,082 | * | 8/1999 | Steinmeyer ............................ | 62/51.1 |
| 5,950,444 | * | 9/1999 | Matsunaga ........................... | 62/259.2 |
| 5,983,646 | * | 11/1999 | Grothe et al. ............................... | 62/6 |

* cited by examiner

Primary Examiner—William Doerrler
(74) Attorney, Agent, or Firm—Eitan, Pearl, Latzer & Cohen-Zedek

(57) ABSTRACT

A cooling device for RF filters and a low noise amplifier is provided. The device supports and effects simultaneous cryogenic cooling of a plurality of radio frequency filters to a first temperature, and of a low-noise amplifier array, electically connected to the filters, to a second higher temperature. The device includes a two-stage refrigerating engine having spaced-apart first stage and second stage gas expansion chambers. The filters are mounted in thermal communication with the second stage gas expansion chamber and the low-noise amplifier array is mounted in thermal communication with the first stage gas expansion chamber.

7 Claims, 1 Drawing Sheet

COOLING DEVICE FOR RF FILTERS AND A LOW NOISE AMPLIFIER

FIELD AND BACKGROUND OF THE INVENTION

The present invention relates to cooling of electronic components used for the receipt of electromagnetic signals.

More particularly, the invention provides an apparatus for cryogenic cooling of filters and amplifiers, such cooling improving the signal-to-noise ratio of radio frequency (RF) signals received by an antenna of the type typically used in relay stations servicing cellular telephones.

Powerful and sensitive antennas are required to receive the weak electromagnetic signals emitted at a distance, by cellular phones or by communication devices. Essential electronic components for such purpose are filters to cut out noise and amplifiers for increasing signal strength. A radiation shield is also helpful in cutting out unwanted incoming thermal radiation and in reducing heat gain of the electronic components and so to reduce the load on the cooler.

In practice satisfactory results are obtained by the use of superconducting filters matched with a low-noise amplifier array. High temperature superconducting filters operate well when cooled to a temperature of between 60–80K. The amplifier array and radiation shield also require cooling, although these components operate safisctorily in a 90–110K temperature range.

Prior art cooling devices use a single stage cryogenic cooler, which is arranged to operate at a temperature of about 60 K in order to meet the demands of filter cooling. The amplifiers and radiation shield are also thermally connected to the same single source of cooling, and although these latter items are cooled to a lower than necessary temperature, they function in a satisfactory manner.

The disadvantages of such equipment lies in the high power required to operate the cooler, and in its corresponding size, weight, first cost and running cost As the working temperature of any refrigerator is lowered, the work required to transfer a given amount of heat increases. This is evident from the following formula. If W equals the work required to extract the heat Q at a low temperature t and reject it at a higher temperature T, the Carnot relationship holds that $W=Q[(T-t)/t]$.

A further disadvantage in cooling the radiation shield and the amplifier array to a lower than necessary temperature lies in the fact that these components are responsible, for different reasons, for most of the cooling load. The amplifier array because it is an active heatgenerating device, and the radiation shield because of its substantial size. Furthermore, during start up the cooler is delayed in achieving the lower temperature required by the filters during the time it is extracting heat from the amplifier array and radiation shield.

In a previous U.S. Pat. No. 5,197 295 the present inventor disclosed a double stage Stirling cryogenic cooler with an infra red (IR) focal plane array detector directly mounted on top of the cooler's expander second stage, and with the radiation shield assembly mounted and cooled by the expander first stage to a temperature range of 200–100 K. This specification, relating to the higher frequency and smaller wavelength of IR equipment did not teach or suggest such cooling method to solve the problems involved in equipment such as superconducting filters, or for the lower frequencies and larger wavelengths used by radio waves.

SUMMARY OF THE INVENTION

It is therefore one of the objects of the present invention to obviate the disadvantages of prior art coolers for RF antennas and to provide a cooler which requires less power to operate and has a lower capital cost.

The present invention achieves the above objects by providing a device for supporting and effecting simultaneous cryogenic cooling of a plurality of radio frequency filters to a first temperature, and a low-noise amplifier array electrically connected to the fitters to a second higher temperature, the device comprising a two-stage refrigerating engine having spaced-apart first stage and second stage gas expansion chambers, the filters being mounted in thermal communication with the second stage gas expansion chamber. The low-noise amplifier array is mounted in thermal communication with the first stage gas expansion chamber.

In a preferred embodiment of the present invention there is provided a cooling device further comprising a radiation shield mounted in thermal communication with said first stage gas expansion chamber and being cooled thereby to the second temperature.

In a further preferred embodiment of the present invention there is provided a cooling device being part of a multiple-channel receiver antenna for electromagnetic radiation emitted by cellular telephones.

Yet further embodiments of the invention will be described hereinafter.

Additionally, more power is saved due to the shorter start up time in reaching specified temperatures. Start up time is a function of the thermal mass of the cooled components, but start up time is shorter when equipment is cooled to a higher temperature.

BRIEF DESCRIPTION OF THE DRAWINGS

The invention will now be described further with reference to the accompanying drawing, which represents by example a preferred embodiment of the invention. Structural details are shown only as far as necessary for a fundamental understanding thereof. The described examples, together with the drawing, will make apparent to those skilled in the art how further forms of the invention may be realized.

In the Drawing, FIG, 1 is a schematic view of a preferred embodiment of the cooler according to the invention.

DESCRIPTION OF THE PRESENT INVENTION

Figure 1:
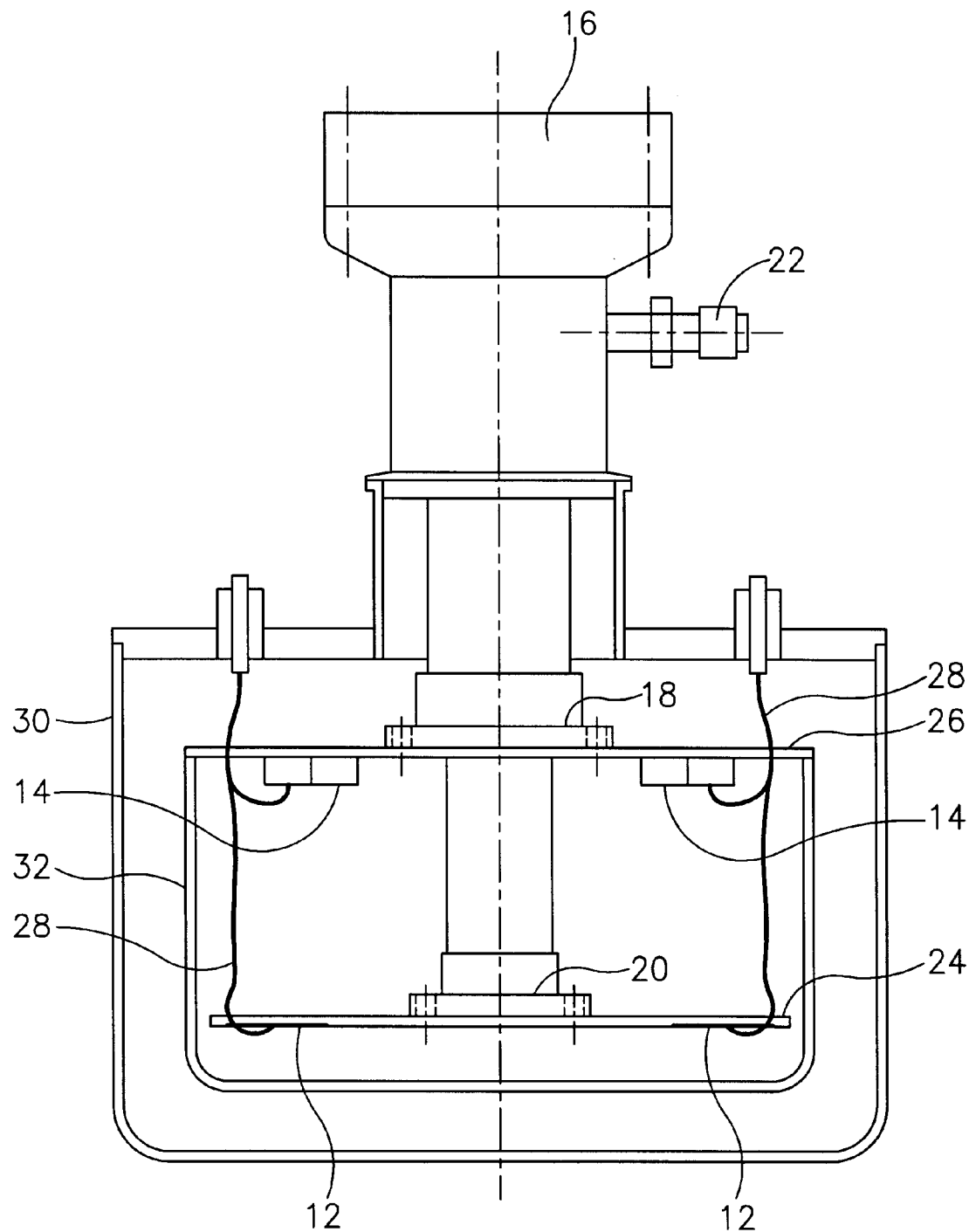

There is seen in FIG. 1 a device 10 for supporting and effecting simultaneous cryogenic cooling of a plurality of radio frequency filters 12 to a first temperature, and a low-noise amplifier array 14 to a second higher temperature.

Suitably the second temperature is in the range 90–110 K.

The device comprises a two-stage refrigerating engine 16 having spaced-part first stage 18 and second stage 20 gas expansion chambers, Typically the gas used is Helium, which after expansion is recycled through the port 22 for recompression.

Advantageously the engine operates on the Stirling cycle. Other types of engine having two-stage outputs, such as Gifford McMahon type or the Pulse tube type may be used.

Filters 12 are preferably of the high temperature superconducting type, and a suitable first temperature therefor is in the range 60–80 K.

Filters 12 are mounted on a base-plate 24 in thermal communication with the second stage gas expansion chamber 20.

The low-noise amplifier array 14 is mounted on a base plate 26 mounted in thermal communication with the first stage gas expansion chamber 18. The first stage 18 being larger than the second stage 20, provides stiffer support for the amplifier base plate 26, which is advantageous in meeting the precise positioning requirements of the antenna (not shown).

Each amplifier in the array 14 is electrically connected by a coaxial cable 28 to a filter 12, and extends out of the vacuum container 30. The cables 28 are then connected to the main electronic system (not shown) processing the received signals.

Advantageously as shown the cooling device 10 further comprises a radiation shield 32 to reduce unwanted incoming heat radiation. The shield 32 operates best when cooled, and is also mounted on the base-plate 26 which in turn is mounted in thermal communication with the first stage gas expansion chamber 18. The shield is cooled thereby to the second temperature, suitably in the range 90–110 K.

The cooling device 10 further comprises a vacuum chamber 30 surrounding the radio frequency filters 12, the low-noise amplifier array 14 and the radiation shield 32, to prevent inward heat leakage by conduction or convection.

The cooling device 10 may suitably form part of a multiple-channel receiver antenna for electromagnetic radiation emitted by cellular telephones, as used in ground stations operated by companies providing cellular phone service.

The scope of the described invention is intended to include all embodiments coming within the meaning of the following claims. The foregoing examples illustrate useful forms of the invention, but are not to be considered as limiting its scope, as those skilled in the art will readily be aware that additional variants and modifications of the invention can be formulated without departing from the meaning of the following claims.

What is claimed is:

1. A device for supporting and effecting simultaneous cryogenic cooling of a plurality of radio frequency filters to a first temperature, and a low-noise amplifier array electrically connected to said filters to a second higher temperature, the device comprising a two-stage refrigerating engine having spaced-apart first stage and second stage gas expansion chambers, said filters being mounted in thermal communication with said second stage gas expansion chamber and said low-noise amplifier array being mounted in thermal communication with said first stage gas expansion chamber.

2. The cooling device as claimed in claim 1, further comprising a radiation shield mounted in thermal communication with said first stage gas expansion chamber and being cooled thereby to said second temperature.

3. The cooling device as claimed in claim 1, further comprising a vacuum chamber surrounding said radio frequency filters and said low-noise amplifier array.

4. The cooling device as claimed in claim 1, wherein said engine operates on the Stirling cycle.

5. The cooling device as claimed in claim 1, wherein said filters are of the high temperature superconducting type, and said first temperature is in the range 60–80 K.

6. The cooling device as claimed in claim 1, wherein said second temperature is in the range 90–110 K.

7. The cooling device as claimed in claim 1, being part of a multiple-channel receiver antenna for electromagnetic radiation emitted by cellular telephones.

\* \* \* \* \*

UNITED STATES PATENT AND TRADEMARK OFFICE
CERTIFICATE OF CORRECTION

PATENT NO. : 6,298,670 B1
DATED : October 9, 2001
INVENTOR(S) : Pundak, Nachman

It is certified that error appears in the above-identified patent and that said Letters Patent is hereby corrected as shown below:

<u>Title page,</u>
Item [75], under "Inventor", please delete "Israel" and insert "Kibbutz Ein Harod Yichud".
Item [73], under "Assignee", please delete "IS" and insert -- IL --.

Signed and Sealed this

Fourth Day of June, 2002

Attest:

JAMES E. ROGAN
Attesting Officer          Director of the United States Patent and Trademark Office